(12) United States Patent
Chen

(10) Patent No.: US 7,564,697 B2
(45) Date of Patent: Jul. 21, 2009

(54) FASTENING DEVICE FOR INTERFACE CARD

(75) Inventor: Hsin-Hung Chen, Taipei (TW)

(73) Assignee: ASUSTek Computer Inc., Taipei (TW)

( * ) Notice: Subject to any disclaimer, the term of this patent is extended or adjusted under 35 U.S.C. 154(b) by 494 days.

(21) Appl. No.: 11/393,722

(22) Filed: Mar. 31, 2006

(65) Prior Publication Data
US 2006/0238992 A1    Oct. 26, 2006

(30) Foreign Application Priority Data
Apr. 25, 2005    (TW) ................ 94113155 A

(51) Int. Cl.
H05K 7/12    (2006.01)
(52) U.S. Cl. ............... 361/801; 361/726; 361/732; 361/747; 361/759; 312/223.2
(58) Field of Classification Search ........... 361/801, 361/726, 732, 740, 747, 759; 312/223.2, 312/223.3
See application file for complete search history.

(56) References Cited

U.S. PATENT DOCUMENTS 6,173,843 B1 * 1/2001 Christensen et al. ..... 211/41.17
6,299,468 B1 * 10/2001 Lin ........................... 439/327
6,430,056 B1 * 8/2002 Chen ......................... 361/759
6,487,089 B1 * 11/2002 Otis .......................... 361/796
6,885,565 B2 * 4/2005 Shi ........................... 361/801
7,002,811 B2 * 2/2006 Jing et al. .................. 361/801
7,057,902 B2 * 6/2006 Li ............................. 361/801

FOREIGN PATENT DOCUMENTS

CN    2492869 Y    5/2002

* cited by examiner

Primary Examiner—Dameon E Levi
(74) Attorney, Agent, or Firm—Rabin & Berdo, PC

(57) ABSTRACT

A fastening device for fastening an interface card of a computer. The computer has a motherboard, a casing and the interface card. The motherboard has a motherboard slot, and the casing includes a casing opening and a locking portion. The interface card has a fastening part. When the interface card is inserted into the motherboard slot, the fastening part disposed on the interface card is exposed outside the casing opening and adjacent to the locking portion. The fastening device comprises a positioning box and a securing member. The positioning box disposed on the casing has a box opening and a positioning slot. The securing member is movably disposed within the positioning box and has a pushing part and a securing part. When the pushing part is drawn back into the positioning box, the interface card is dissembled from the motherboard slot.

18 Claims, 5 Drawing Sheets

FASTENING DEVICE FOR INTERFACE CARD

This application claims the benefit of Taiwan application Serial No. 94113155, filed Apr. 25, 2005, the subject matter of which is incorporated herein by reference.

BACKGROUND OF THE INVENTION

1. Field of the Invention

The present invention relates to a fastening device, and more particularly to a fastening device for fastening an interface card of a computer.

2. Description of the Related Art

A prior motherboard installed in a computer usually includes lots of plugging slots. The plugging slots are used for plugging variety of interface cards for computer peripheral components, such as a sound card for a speaker, a display card for a display device, and an interface card for a printer. Mostly, the above-mentioned sound card and display card are adapted to a peripheral component interface (PCI) standard.

A PCI interface card usually has two sides; one side is connected to a casing of a computer and the other side is connected to a motherboard of the computer. The PCI interface card is used for receiving or transmitting signals to the computer peripheral components. The other side connected to the motherboard is used for transmitting received signals from outside peripheral components, or transmitting signals from the motherboard to outside peripheral components. During users or engineers install the PCI interface card, one side of the PCI card is first inserted into the motherboard, and then the other side is fastened on the casing by screws. Therefore, the PCI interface card could be fixedly installed on the computer for connecting outside computer peripheral components. On the contrary, when users or engineers would like to change the PCI interface card or disassemble the PCI interface card for maintaining and testing, the screws must be disassembled first by tools, a screwdriver for example, and then the PCI interface card could be disassembled or changed.

Since it needs screwdriver or other tools for disassembling the screws, it is inconvenient for a user or engineer to install or disassemble a PCI interface card. Furthermore, during installing or disassembling the PCI interface card, the screws are often lost or damaged. Thus, it wastes much time for user or engineer to find lost screws, and prepare or buy new screws.

SUMMARY OF THE INVENTION

It is an aspect of the present invention to provide a fastening device for fastening an interface card of a computer. A user could fix the interface card on a casing of the computer by the fastening device.

According to the aforementioned aspect of the present invention, a fastening device is provided, which is suitable for fixing an interface card of a computer. The computer has a motherboard, a casing and the interface card. The motherboard has a motherboard slot, and the casing has a casing opening and a locking portion. The interface card has a fastening part. The fastening part is disposed on the interface card and is exposed outside the casing opening. When the interface card is inserted into the motherboard slot, the fastening part of the interface card is against the locking portion of the casing. The fastening device of the present invention comprises a positioning box and a securing member. The positioning box is disposed on the casing and near the casing opening. The positioning box includes a box opening and a positioning slot. The securing member is movably disposed within the positioning box. The securing member includes a pushing part and a securing part, wherein a user pushes the pushing part to push the securing part to pass through the positioning box and is exposed outside the box opening, so that the fastening part of the interface card is against the locking portion of the casing, and the interface card is inserted into the motherboard slot tightly. When the pushing part is drawn back into the positioning box, the interface card is disassembled from the motherboard slot.

According to the aforementioned aspect of the present invention, a computer is provided. The computer comprises: a motherboard, the motherboard including a motherboard slot; a casing, the casing including a casing opening; an interface card and a fastening device. The interface card includes a fastening part. When the interface card is inserted into the motherboard slot, the fastening part is exposed outside the casing opening. The fastening device comprises a positioning box and a securing member. The positioning box is disposed on the casing and near the casing opening. The positioning box includes a box opening and a positioning slot. The securing member is movably disposed within the positioning box. The securing member includes a pushing part and a securing part, wherein a user pushes the pushing part to push the securing part to pass through the positioning box and is exposed outside the box opening, so that the fastening part of the interface card is against the locking portion of the casing, and the interface card is inserted into the motherboard slot tightly. When the pushing part is drawn back into the positioning box, the interface card is disassembled from the motherboard slot.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

The present invention provides a fastening device for an interface card of a computer. The computer includes a motherboard, a casing and an interface card. The motherboard includes a motherboard slot. The casing includes an opening and a locking portion. The interface card includes a fastening part, a first side and a second side. When the first side of the interface card is inserted into the motherboard slot, the fastening part of the interface card is against the locking portion of the casing. The fastening part is disposed on the second side of the interface card, and is exposed outside the opening. The fastening device of the present invention is used for locking the fastening part of the interface card on the locking portion of the casing, while the fastening part of the interface card is inserted into the motherboard slot.

The following two embodiments of the present invention are illustrated of the present invention rather than limiting of the present invention. It is intended that various modifications and similar arrangements be included within the spirit and scope of the present invention.

First Embodiment

Figure 1:
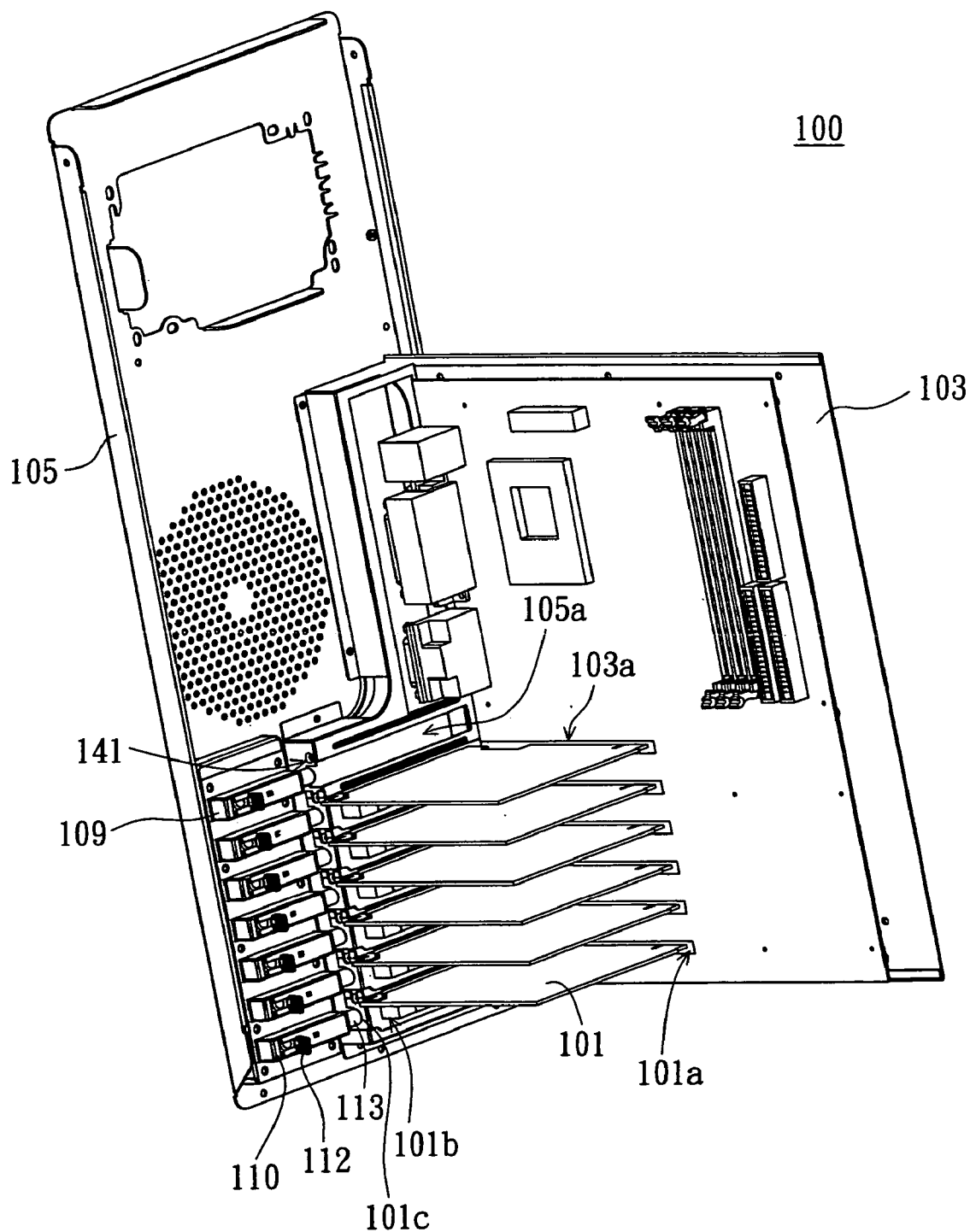
FIG. 1 depicts a perspective view showing a fastening device for an interface card on a computer in accordance with a first preferred embodiment of the present invention.

Reference is made to FIG. 1, which depicts a perspective view showing a fastening device for an interface card on a computer in accordance with a first preferred embodiment of the present invention. The computer 100 comprises a motherboard 103, a casing 105 and an interface card 101. The motherboard 103 includes a motherboard slot 103a. The casing 105 includes an opening 105a and a locking portion 141. The interface card 101 includes a fastening part 101c, a first side 101a and a second side 101b. The fastening device for the interface card 101 includes a positioning box 109 and a securing member 111 (as shown in FIG. 2B), which is disposed within the positioning box 109. The first side 101a of the interface card 101 is inserted into the motherboard slot 103a of the motherboard 103. The fastening part 101c is disposed on the second side 101b of the interface card 101 and is exposed outside the opening 105a. When the first side 101a of the interface card 101 is inserted into the motherboard slot 103a, the fastening part 101c of the interface card 101 is against the locking portion 141 of the casing 105. And at least one positioning box 109 is fixed on the casing 105 and adjacent to the opening 105a of the casing 105.

Figure 2A:
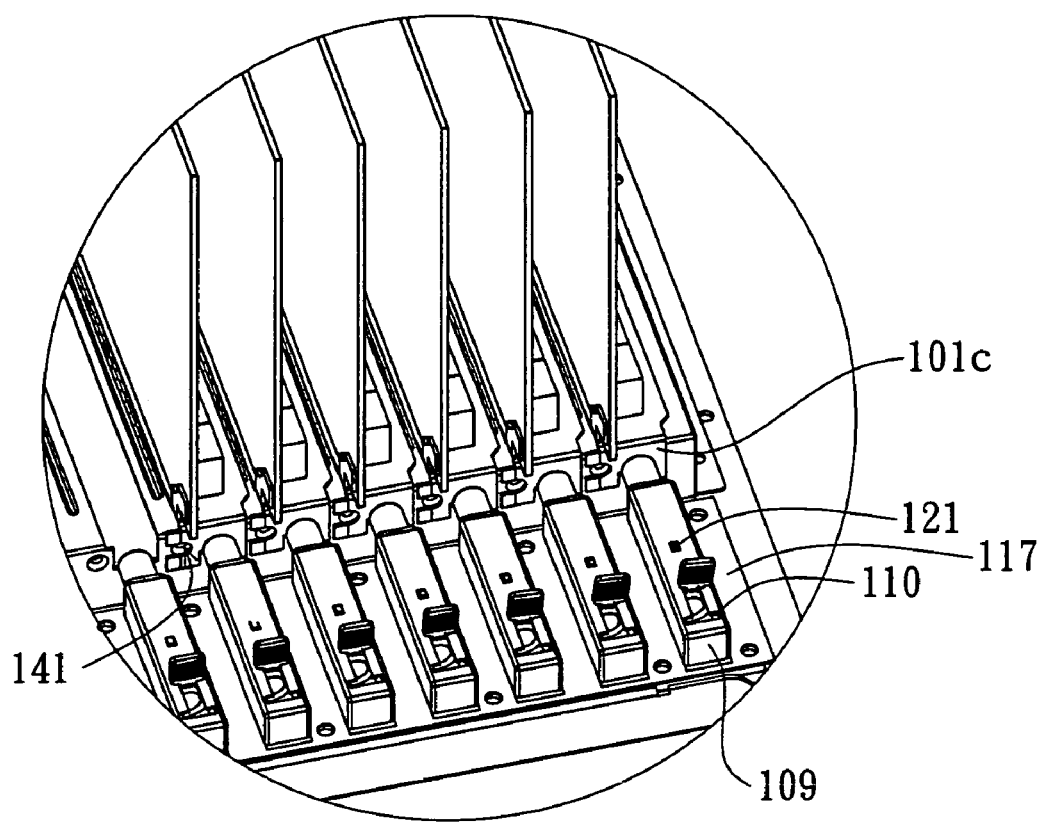
FIG. 2A depicts a perspective view showing the positioning box of the fastening device in accordance with the first preferred embodiment of the present invention.
Figure 2B:
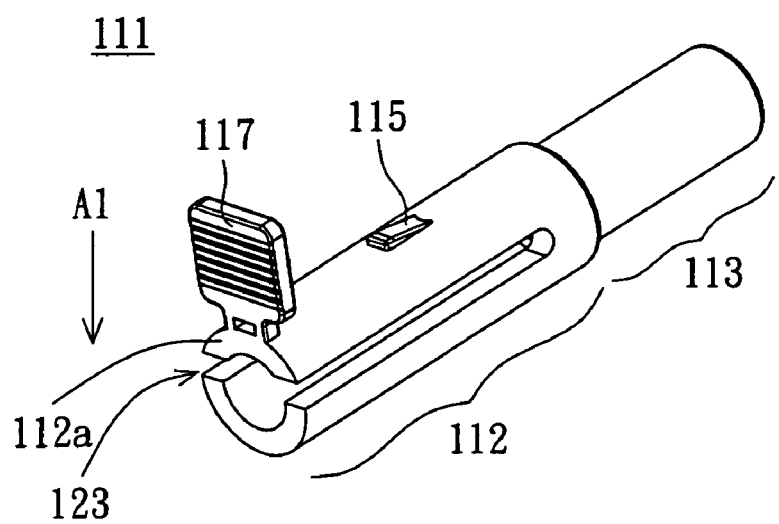
FIG. 2B depicts a perspective view showing the positioning box of the fastening device in accordance with the first preferred embodiment of the present invention.
Figure 2C:
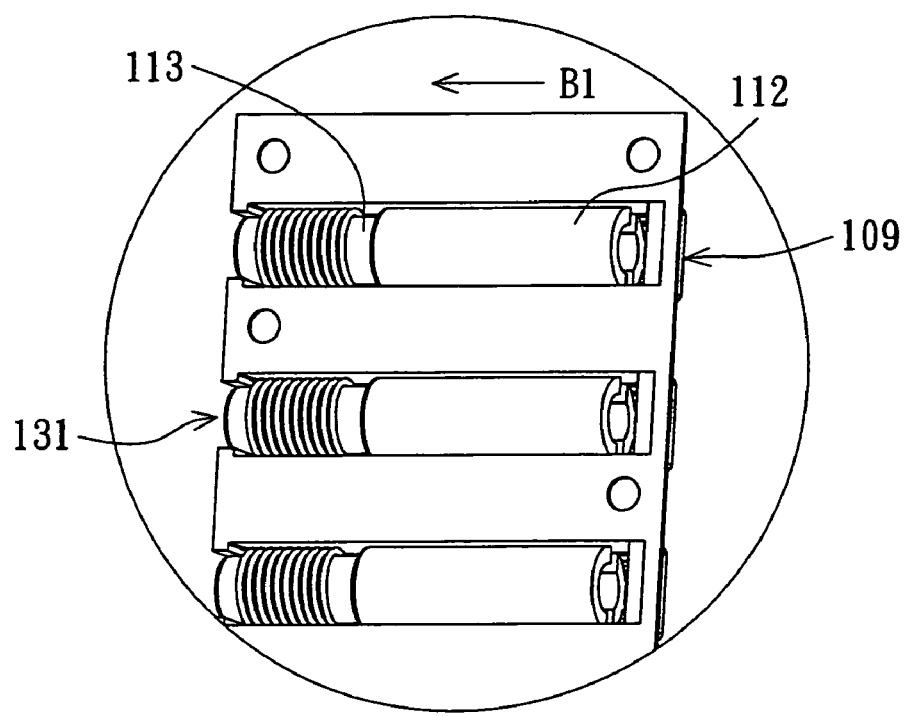
FIG. 2C depicts a perspective view showing the backside of the securing member and the positioning box at a beginning position in accordance with the first preferred embodiment of the present invention.

Reference is made to FIG. 2A, which depicts a perspective view showing the positioning box 109 of the fastening device and the interface card 101 in accordance with the first preferred embodiment of the present invention. The positioning box 109 is disposed on the casing 105. The positioning box 109 includes a leading slot 110, a box opening 131 (as shown in FIG. 2C) and a positioning slot 121. The securing member 111 is movably disposed within the positioning box 109. As shown in FIG. 2B, the securing member 111 includes a pushing part 112 and a securing part 113, which connect with each other. The cross-sectional of the securing member 111 is preferred a ring shape. The material of the securing member 111 is preferred to be plastics, and the material of the positioning box 109 is preferred to be metal.

Reference is made to both FIGS. 2A and 2B, wherein the FIG. 2B depicts a perspective view showing the securing member 111 of the fastening device in accordance with the first preferred embodiment of the present invention. The securing member 111 further includes a pushing shaft 117 and a deformable space 123. The pushing shaft 117 protrudes from a surface of the securing member 111 and exposes outside the leading slot 110 of the positioning box 109. The pushing shaft 117 is used to provide a place for applying a force by a user. The pushing part 112 of the securing member 111 includes a flexible arm 112a, which could be bent upward or downward in the deformable space 123 with flexibility. When user pushes the pushing shaft 117 along an A1 direction, the flexible arm 112a bends downward, as shown in FIG. 2B.

Referring to FIG. 2B, the securing member 111 further includes a protrusion 115. The protrusion 115 is disposed on the flexible arm 112a. The protrusion 115 is selectively lodged in the positioning slot 121. When the flexible arm 112a bends downward, the protrusion 115 could be released from the positioning slot 121. When the pushing part 112 pushes the securing part 113 to pass through the positioning box 109 and expose outside the box opening 131 (as shown in FIG. 2C), the fastening part 101c of the interface card 101 is against the locking portion 141 of the casing 105, and the first side 101a of the interface card 101 is against the motherboard slot 103a of the motherboard 103. At the same time, the protrusion 115 of the securing member 111 is lodged in the positioning slot 121. When the protrusion 115 is separated from the positioning slot 121, the interface card 101 could be drawn from the motherboard slot 103a of the motherboard 103.

Figure 2D:
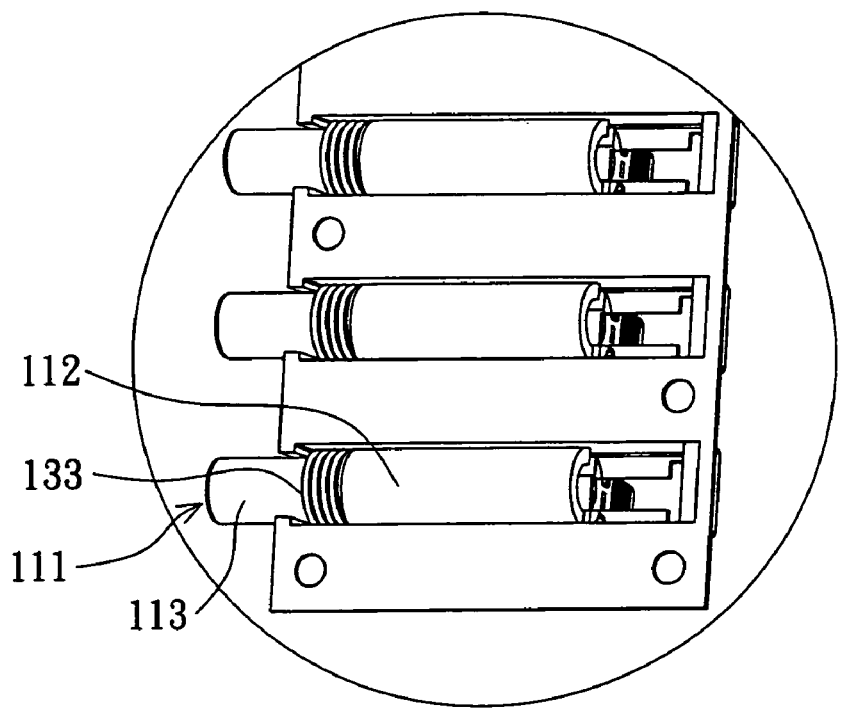
FIG. 2D depicts a perspective view showing the backside of the securing member and the positioning box at a locking position in accordance with the first preferred embodiment of the present invention.

Furthermore, reference is made to both FIGS. 2C and 2D, wherein FIG. 2C depicts a perspective view showing the backside of the securing member 111 and the positioning box 109 at a beginning position in accordance with the first preferred embodiment of the present invention, and FIG. 2D depicts a perspective view showing the backside of the securing member 111 and the positioning box 109 at a locking position in accordance with the first preferred embodiment of the present invention. Before the user installs the interface card 101, the securing member 111 is disposed in the positioning box 109. That is, the pushing part 112 and the securing part 113 of the securing member 111 are both disposed in the positioning box 109. The securing member 111 is at the beginning position. When the user pushes the pushing shaft 117 along a B1 direction, the securing part 113 passes through the positioning box 109 and exposes outside the box opening 131, while the pushing part 112 does not. Because the cross-section area of the securing part 113 is smaller than the cross-section area of the box opening 131, and the cross-section area of the pushing part 112 is larger than both the cross-section areas of the securing part 113 and the box opening 131. The securing part 113 exposed outside the box opening 131 leans against the second side 101b of the interface card 101 tightly, so that the interface card 101 is fixed on the motherboard 103 and the casing 105 reliably. At the same time, the pushing part 112 is leaned against the fastening part 101c of the interface card 101, and the protrusion 115 of the securing member 111 is lodged in the positioning slot 121 of the positioning box 109. The securing member 111 is at the locking position.

Referring further to FIGS. 2C and 2D, there is a flexible component, such as a spring 133, disposed between the positioning box 109 and the securing member 111. When the pushing part 112 moves along the B1 direction, the spring 133 is compressed, so that a potential energy is saved therein. When the user wants to disassemble the interface card 101, the user could push the protrusion 115 or the pushing shaft 117 of the securing member 111 downward. The protrusion 115 moves downward and is released from the positioning slot 121 of the positioning box 109, since the flexible arm 112a is having flexibility. The spring 133 provides a resilient force to the securing member 111, so that the securing part 113 moves back into the positioning box 109, and the securing member 111 moves back to the beginning position.

Second Embodiment

Figure 3A:
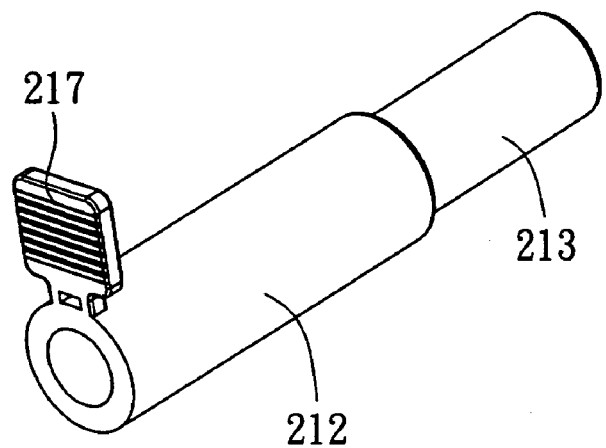
FIG. 3A depicts a perspective view showing a securing member in accordance with the second preferred embodiment of the present invention.
Figure 3B:
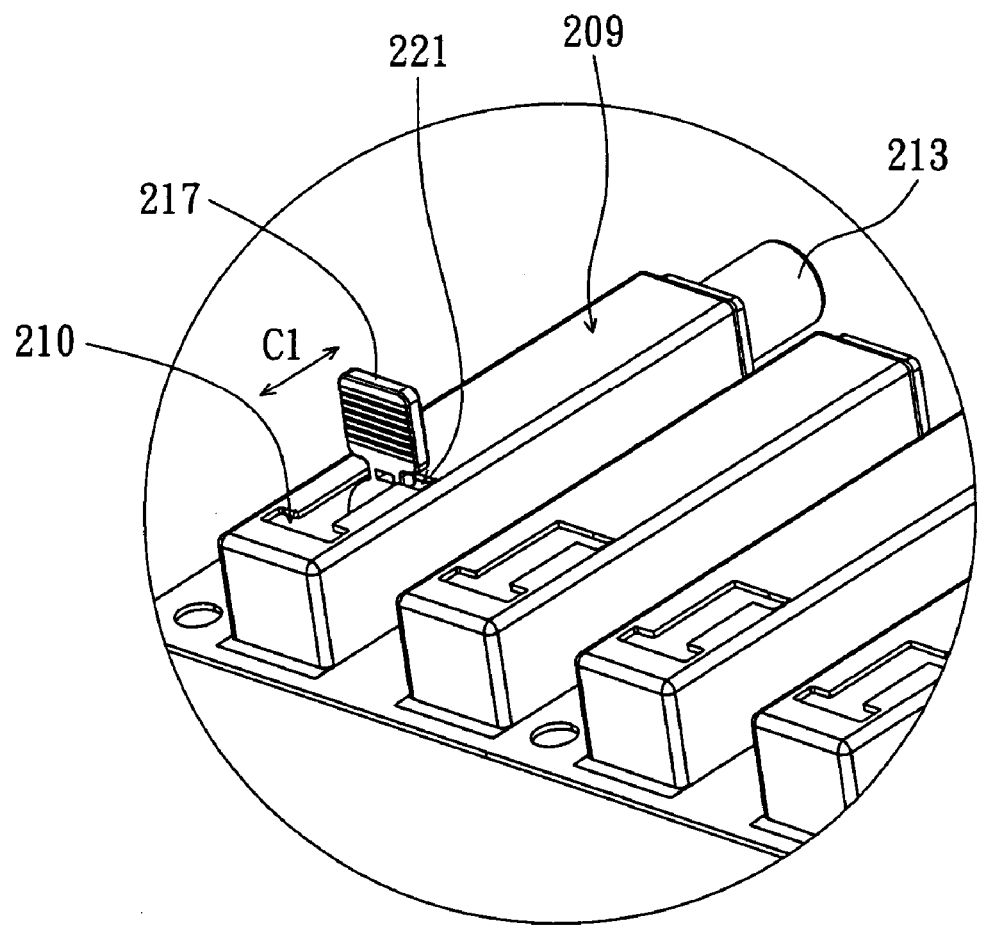
FIG. 3B depicts a perspective view showing a positioning box and a securing member in accordance with the second preferred embodiment of the present invention.
Figure 3C:
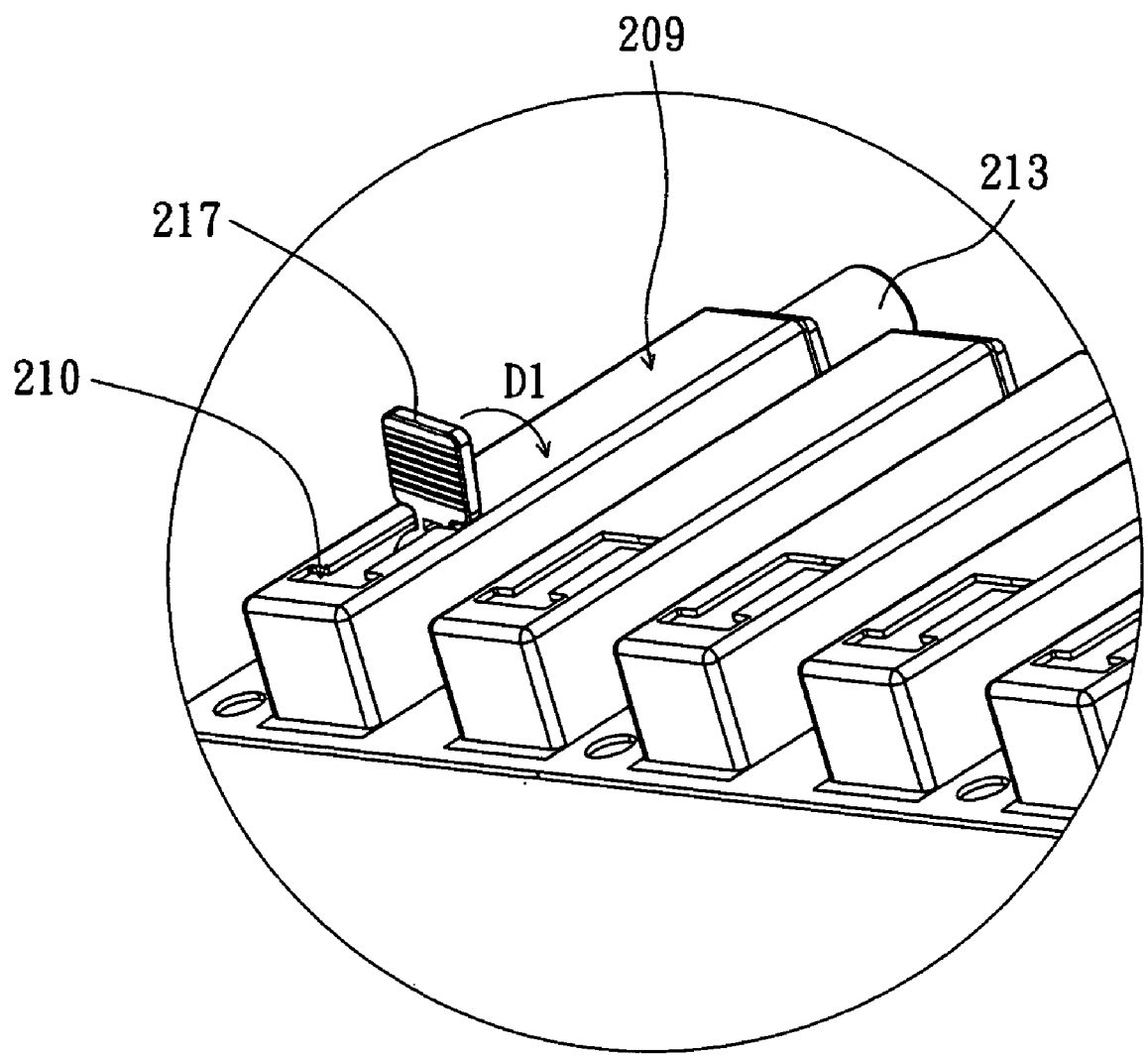
FIG. 3C depicts a perspective view showing a positioning box and a securing member at a locking position in accordance with the second preferred embodiment of the present invention.

Reference is made to FIGS. 3A, 3B and 3C. FIG. 3A depicts a perspective view showing a securing member 211 in accordance with the second preferred embodiment of the present invention. FIG. 3B depicts a perspective view showing a positioning box 209 and a securing member 211 in accordance with the second preferred embodiment of the present invention. FIG. 3C depicts a perspective view showing a positioning box 209 and a securing member 211 at a locking position in accordance with the second preferred embodiment of the present invention. Unlike the first preferred embodiment of the present invention, a positioning slot 221 and a leading slot 210 of the second preferred embodiment of the present invention are connected. That is, the positioning slot 221 and the leading slot 210 could be integrally formed, as shown in FIG. 3B. As shown in FIG. 3A, the securing member 211 comprises a pushing shaft 217, a pushing part 212, and a securing part 213. The pushing shaft 217 is disposed on one end of the pushing part 212, and the pushing shaft 217 is selectively lodged in the positioning slot 221. Preferably, the positioning slot 221 is disposed on one end of the leading slot 210. The user could push the pushing shaft 217 along a C1 direction, such as from a front end of the leading slot 210 to the back end of the leading slot 210. For example, when the pushing shaft 217 is pushed to the back end of the leading slot 210, the user could push the pushing shaft 217 to rotate along a D1 direction, and the pushing shaft 217 is lodged in the positioning slot 221. When the user want to disassemble the interface card, the user could push the pushing shaft 217 to rotate along a direction reverse to the D1 direction, and the pushing shaft 217 of the securing member 211 is separated from the positioning slot 221 of the positioning box 209. A spring disposed between the securing member 211 and the positioning box 209 provides a resilient force to move the securing member 211 back to a beginning position. Preferably, the leading slot 210 combines the positioning slot 221 together to form a "J" shape. However, the shape that the leading slot 210 and the positioning slot 221 combine is not limited to the "J" shape; any shape for performing the same function of lodging the securing member 211 could be used.

Therefore, according to the aforementioned preferred embodiments, the advantage of the fixing apparatus of the present invention is that a user could install and disassemble the interface card without any tool: Instead, the user could install and disassemble the interface card manually by a securing member of the present invention. Comparing with the prior method of using screws and screwdriver, the present invention is very convenient and saves lots of time.

As is understood by a person skilled in the art, the foregoing preferred embodiments of the present invention are illustrated of the present invention rather than limiting of the present invention. It is intended that various modifications and similar arrangements be included within the spirit and scope of the appended claims, the scope of which should be accorded the broadest interpretation so as to encompass all such modifications and similar structure.

What is claimed is:

1. A fastening device for fastening an interface card of a computer, the computer including a motherboard, a casing and the interface card, the motherboard including a motherboard slot, the casing including a casing opening and a locking portion, the interface card including a fastening part, wherein the fastening part is disposed on the interface card and is exposed outside the casing opening, and when the interface card is inserted into the motherboard slot, the fastening part of the interface card is near the locking portion of the casing, the fastening device comprising:

a positioning box disposed on the casing and having a box opening and a positioning slot; and a securing member movably disposed within the positioning box and including a pushing part and a securing part coaxially connected to the pushing part, wherein the pushing part pushes the securing part to pass through the positioning box and expose outside the box opening, so that the securing part presses the fastening part of the interface card against the locking portion of the casing, and the interface card is inserted into the motherboard slot tightly, wherein when the pushing part is drawn back into the positioning box, the interface card is disassembled from the motherboard slot.

2. The fastening device according to claim 1, wherein the positioning box further comprises a flexible component, disposed between the positioning box and the securing member, and wherein when the securing member disassembling from the positioning slot, the flexible component provides a resilient force to the securing member, so that the securing member moves back into the positioning box.

3. The fastening device according to claim 1, wherein the positioning box includes a leading slot, and the securing member includes a pushing shaft, the pushing shaft protruding from a surface of the securing member and outside the leading slot, and the pushing shaft used to provide a pushing place for a user.

4. The fastening device according to claim 3, wherein the positioning slot and the leading slot are connected, and the pushing shaft of the securing member is selectively lodged in the positioning slot.

5. The fastening device according to claim 1, wherein the securing member includes a protrusion, disposed on a surface of the securing member.

6. The fastening device according to claim 5, wherein the protrusion is selectively lodged in the positioning slot.

7. The fastening device according to claim 5, wherein the pushing part of the securing member includes a flexible arm, the protrusion is disposed on the flexible arm, and the flexible arm bends upward and downward with the protrusion, so that the protrusion is selectively lodged in the positioning slot.

8. The fastening device according to claim 7, wherein a deformable space is formed under the flexible arm.

9. The fastening device according to claim 1, wherein the cross-sectional shape of the securing member is a ring shape.

10. The fastening device according to claim 1, wherein the material of the securing member includes plastics.

11. The fastening device according to claim 1, wherein the material of the positioning box includes metal.

12. A computer, comprising:

a motherboard having a motherboard slot;

a casing having a casing opening;

an interface card including a fastening part, the interface card being inserted into the motherboard slot, the fastening part being exposed outside the casing opening; and a fastening device comprising:

a positioning box disposed on the casing and having a box opening and a positioning slot; and a securing member, movably disposed within the positioning box and including a pushing part and a securing part coaxially connected to the pushing part, wherein the pushing part pushes the securing part to pass through the positioning box and expose outside the box opening, so that the securing part presses the fastening part of the interface card against the locking portion of the casing, and the interface card is inserted into the motherboard slot tightly, wherein when the securing member is released from the positioning slot, the interface card is disassembled from the motherboard slot.

13. The computer according to claim 12, wherein the positioning box further comprises a flexible component, disposed between the positioning box and the securing member, and wherein when the securing member disassembling from the positioning slot, the flexible component provides a resilient force to the securing member, so that the securing member moves back into the positioning box.

14. The computer according to claim 12, wherein the positioning box includes a leading slot, and the securing member includes a pushing shaft, the pushing shaft protruding from a surface of the securing member and outside the leading slot, and the pushing shaft used to provide a pushing place for a user.

15. The fastening device according to claim 14, wherein the positioning slot and the leading slot are connected, and the pushing shaft of the securing member is selectively lodged in the positioning slot.

16. The fastening device according to claim 12, wherein the securing member includes a protrusion, disposed on a surface of the securing member.

17. The computer according to claim 16, wherein the protrusion is selectively lodged in the positioning slot.

18. The computer according to claim 16, wherein the pushing part of the securing member includes a flexible arm, the protrusion is disposed on the flexible arm, and the flexible arm bends upward and downward with the protrusion, so that the protrusion is selectively lodged in the positioning slot.

* * * * *